United States Patent
Gupta et al.

[11] Patent Number: 5,841,196
[45] Date of Patent: Nov. 24, 1998

[54] FLUTED VIA FORMATION FOR SUPERIOR METAL STEP COVERAGE

[75] Inventors: Subhash Gupta, Saratoga, Calif.; Robert Flores, Austin, Tex.; Michael Ross Stamm, Austin, Tex.; Eric Thomas Sharp, Austin, Tex.; Erich W. E. Denninger, Buda, Tex.; Pamela G. Dye; Joel Samuel Utz, both of Austin, Tex.; James K. Kai, San Francisco, Calif.

[73] Assignee: Advanced Micro Devices, Inc.

[21] Appl. No.: 970,314

[22] Filed: Nov. 14, 1997

Related U.S. Application Data

[62] Division of Ser. No. 696,774, Aug. 13, 1996, Pat. No. 5,746,884.

[51] Int. Cl.$^6$ .................................................. H01L 21/00
[52] U.S. Cl. .......................... 257/774; 438/637; 438/734; 216/39; 216/67
[58] Field of Search .................... 216/67, 79, 18, 216/39; 438/713, 714, 723, 724, 734, 743, 744, 637, 638, 640, 672, 675; 257/773, 774, 775, 760

[56] References Cited

U.S. PATENT DOCUMENTS

| | | |
|---|---|---|
| 3,986,912 | 10/1976 | Alcorn et al. . |
| 4,354,897 | 10/1982 | Nakajima . |
| 4,484,978 | 11/1984 | Keyser ................................. 438/734 X |
| 4,729,815 | 3/1988 | Leung ................................. 438/734 X |
| 4,857,141 | 8/1989 | Abe et al. . |
| 4,978,420 | 12/1990 | Bach . |
| 5,453,403 | 9/1995 | Meng et al. ............................. 438/734 |
| 5,591,675 | 1/1997 | Kim et al. . |

*Primary Examiner*—William Powell
*Attorney, Agent, or Firm*—Kevin L. Daffer; Conley, Rose & Tayon

[57] ABSTRACT

A method of forming a via in a interlevel dielectric of a semiconductor device wherein the via has a fluted sidewall. A semiconductor substrate is provided having a first conductive layer formed thereon. A dielectric layer is then formed on the first conductive layer. A photoresist layer is deposited on a dielectric layer and a contact opening is formed in the photoresist layer to expose a contact region of the dielectric layer. A first etch step is performed to remove portions of the dielectric layer proximal to the contact region to form a first stage of the fluted via. The first stage includes a first sidewall stage extending from an upper surface of the dielectric layer at an angle less than 50°. The first stage of the fluted via exterds a first lateral distance which is greater than a lateral dimension of the contact opening. A second etch step is then performed to further remove portions of the dielectric layer to form a second stage of the fluted via. The second stage includes a second sidewall stage extending from the first sidewall stage at a second angle between 40° and 70°. A third etch step is then performed to further remove portions of the dielectric layer to form a third and final. stage of the fluted via. The fluted via extends from an upper surface of the dielectric layer to an upper surface of the first conductive layer. The third stage includes a third stage sidewall extending from said second stage side wall to said upper surface of said first conductive layer at an angle between 60° and 80°.

5 Claims, 4 Drawing Sheets

FLUTED VIA FORMATION FOR SUPERIOR METAL STEP COVERAGE

This is a Division of application Ser. No. 08/696,774, filed Aug. 13, 1996, now U.S. Pat. No. 5,746,883.

BACKGROUND OF THE INVENTION

1. Field of the Invention

This invention relates to the semiconductor processing and more particularly to a method for forming a fluted via structure by using a three step etch process including.

2. Description of the Relevant Art

Semiconductor devices utilizing multiple levels of interconnect are well known in the semiconductor industry. Multiple interconnect levels enable 1) increased functional complexity by allowing densely packed transistors to be interconnected and 2) improved performance by reducing the average length and, thus, the RC delay of the interconnects. Each interconnect level must be electrically isolated from adjacent interconnect levels by an interlevel dielectric (ILD). To provide paths for selectively coupling adjacent interconnect layers, vias or contacts are etched into the interlevel dielectric. The profile of the vias can have a significant impact on the reliability and performance of the device, especially as the critical dimensions of the interconnects decreases below 1 micron. More specifically, the profile of the via sidewall directly impacts the step coverage achievable during the subsequent deposition of an interconnect layer. Generally, step coverage decreases over significant discontinuities in the sidewall. If the via profile significantly reduces the step coverage, reliability is affected because electromigration in the narrow portions of the interconnect can eventually result in a highly resistive or open interconnect.

Competing considerations have driven the technology of via formation. From the perspective of step coverage, gently sloping vias that are wide at the top and narrow at the bottom are preferred because the step coverage achievable over such profile is greater. On the other hand, steep, nearly vertical vias can be more densely located and are therefore desirable in areas of dense circuitry. The problems of achieving adequate step coverage over steep profile via structures is commonly overcome through the use of interconnect plugs. Interconnect plugs are typically formed by blanket depositing a conductive material such as tungsten to fill the via structure and subsequently removing the tungsten material from regions exterior to the via structure with a planarization process. In addition to the extra processing required by a plug technology, tungsten type plugs are of higher resistivity than the aluminum that is commonly used as the interconnect material. The resistivity of the interconnect must be minimized in submicron technologies because the interconnect resistivity can become a speed limiting parameter.

Previous processes have attempted to combine the superior step coverage obtainable with sloped via profiles with the density achievable through the use of steep walled vias. Referring to FIG. 1, a wine glass contact 16 is shown. Wine glass contact 16 includes an upper region 12 and a lower region 14. Upper region 12 is formed through the use of an isotropic etch process such as a conventional HF wet etch. The isotropic etch used to form upper region 12 of wine glass contact 16 results in sloped surfaces 20. Lower region 14 of wine glass contact 16 is generally formed with a conventional dry etch process that typically results in substantially perpendicular and straight via sidewalls in lower region 14. The combination of the isotropic etch used to form upper region 12 and the dry, anisotropic etch used to form lower region 14 results in a dielectric protrusion 18 in wine glass contact 16 at the point of discontinuity between the profile of upper region 12 and the profile of lower region 14. Turning now to FIG. 2, a processing step subsequent to FIG. 1 is shown in which a conductive material has been deposited to form conductive layer 19. As seen in FIG. 2, conductive layer 19 is significantly thinner in the vicinity 22 of dielectric peak 18. This conductive layer thinning is characteristic of films sputtered into wine glass type via structures. The thinning of conductive layer 19 in the vicinity of dielectric peak 18 results in a higher resistivity in region 22. The higher resistivity can slow the performance of the circuit and can result in electromigration that can create a highly resistive conductive layer 19 that can eventually result in an open circuit in the vicinity of region 22.

To avoid the characteristic thinning associated with the wine glass contact 16 of FIG. 1, the tapered contact 26 shown in FIG. 3 is commonly used. Dielectric layer 11 is deposited or formed on an upper surface of semiconductor substrate 10. Thereafter, tapered contact structure 26 is etched into dielectric layer 11.

Tapered contact structure 26 is shown as comprising a pair of symmetrical and opposing sidewalls 28a and 28b. Sidewall 28a and 28b are sloped such that they form an angle a with respect to upper surface 13 of semiconductor substrate 10. Although the tapered contact structure 26 eliminates the dielectric protrusion 18 associated with the wine glass contact structure 16 of FIG. 1, tapered contact structure 26 does, nevertheless, result in a dielectric corner 29. FIG. 4 shows a processing step subsequent to FIG. 3 in which a conductive layer 19 has been formed on dielectric layer 11 and semiconductor substrate 10. Once again, thinning of conductive layer 19 occurs in vicinity 30 of dielectric corner 29. Like the thinning of the conductive layer that occurs with respect to the wine glass structure 16 of FIGS. 1 and 2, the conductive thinning shown in FIG. 4 can result in a similar increase in resistivity of conductive layer 19. Accordingly, it is desirable to implement a process capable of producing a via profile that does not result in significant thinning of a subsequently deposited conductive material doe to the presence of discontinuities in the sidewall.

SUMMARY OF THE INVENTION

The problems identified above are in large part addressed by a three step etch process for forming a fluted via. Each etch step produces a characteristically distinct sidewall profile. By adjusting the times of the appropriate etch steps, the via profile can be controlled to provide a gently sloping, substantially continuous sidewall extending from an upper surface of the dielectric layer to an upper surface of an underlying conductive layer.

Broadly speaking, the present invention contemplates a method of forming a fluted via. A semiconductor substrate on which a first conductive layer has been formed is provided and a dielectric layer formed on the first conductive layer. A photoresist layer is then deposited on the dielectric layer and a contact opening formed in the photoresist layer to expose a contact region of the dielectric layer. Next, a first etch step is performed to remove portions of the dielectric layer proximal to the contract region. The first etch step produces a first stage of a fluted via. The first stage includes a first stage sidewall extending from an upper surface of the dielectric layer at a first angle. The first angle is preferably less than 50° and, still more preferably, approximately equal to 35°. The first stage of the fluted via has a first lateral dimension and a first vertical dimension. The first etch step undercuts the photoresist layer such that the first lateral dimension of first stage 111 is greater than a lateral dimension of the opening in the photoresist layer. Because of this undercutting, peripheral portions of the photoresist layer shadow portions of the first stage sidewall. A second etch step is then performed in which further portions of the dielectric layer are removed to form a second stage of the fluted via. The second stage of the fluted via includes a second sidewall stage extending from the first sidewall stage at a second angle. The second angle is preferably between 40° and 70° and still more preferably approximately equal to 55°. Next, a third etch step is performed to further remove portions of the dielectric layer thereby forming the third and final stage of the fluted via. The fluted via extends from an upper surface of the dielectric layer to an upper surface of the first conductive layer. The third stage of the fluted via includes a third sidewall stage extending from the second sidewall stage at an angle preferably less than 80° and still more preferably at an angle of approximately 75°.

Preferably, the first etch step has a lateral etch rate that is approximately 1.5 to 1.8 times the vertical etch rate such that the first lateral distance is greater than or equal to the first vertical distance. The first etch step preferably comprises a plasma etch in which $NF_3$, HE, and $O_2$ are present in an approximate ratio of 500:200:0. Preferably, the second etch step etches the photoresist layer and the dielectric layer at approximately the same rate. In a presently preferred embodiment, the second etch step occurs in a plasma etch reactor in which Ar, $CF_4$, $CHF_3$, HE, and $O_2$ are present in an approximate ratio of 100:10:40:250:50. The third etch step preferably occurs in a plasma etch reactor in which Ar, $CF_4$, $CHF_3$, HE, and $O_2$ are present in an approximate ratio of 100:10:70:350:5. Alternatively, the third etch step may be accomplished without $CF_4$. In a presently preferred embodiment, the method still further comprises the steps of stripping the photoresist layer and forming a second conductive layer on the first dielectric layer and within the fluted via so that the second conductive layer contacts the first conductive layer. Ideally, the step coverage of the second conductive layer within the fluted via is approximately is equal to or greater than 30%.

The present invention still further contemplates an interlevel contact structure in a semiconductor device. The contact structure includes a first conductive layer formed on an upper surface of a semiconductor substrate and an interlevel dielectric layer formed on the first conductive layer where the interlevel dielectric layer includes a fluted via. The fluted via is defined by an annular sidewall of the dielectric layer. In a preferred embodiment, the annular sidewall extends from an upper surface of the dielectric layer to an upper surface of the first conductive layer and includes a first sidewall stage that extends from the upper surface of the dielectric layer to a second sidewall stage of the annular sidewall at an angle of less than 50% and still more preferably, at an angle of 35°. The second sidewall stage extends from the first sidewall stage to third sidewall stage at an angle of between 40° and 70°. The third sidewall stage extends from the second sidewall stage to an upper surface of the first conductive layer at an angle of between 60° to 80°. The structure further includes a second conductive layer formed on the interlevel dielectric and within the fluted via such that the second conductive layer contacts the first conductive layer. Preferably, the first and second conductive layers comprise aluminum alloys and the dielectric layer comprises a deposited oxide. Suitably, the step coverage of the second conductive layer in the fluted via is approximately equal to or greater than 30%.

BRIEF DESCRIPTION OF THE DRAWINGS

Other objects and advantages of the present invention will become apparent upon reading the following detailed description and upon reference to the accompanying drawings in which.

Figure 1:
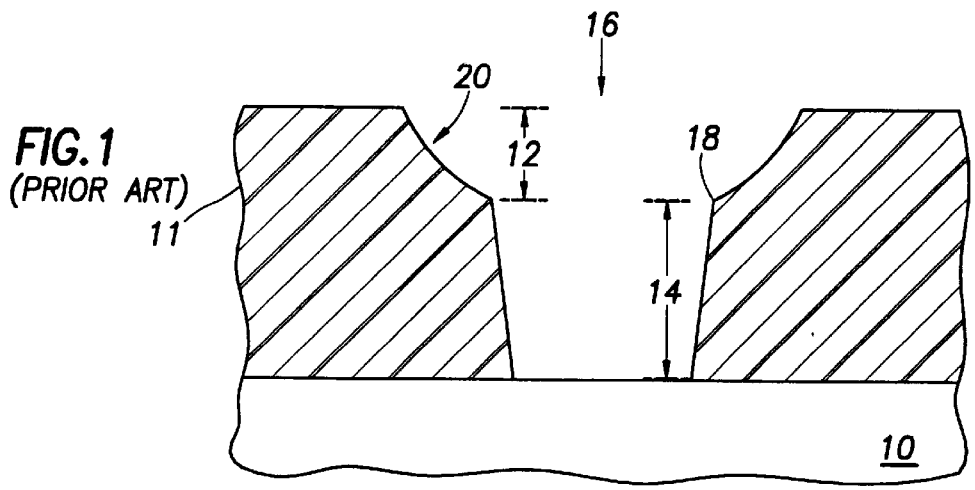
FIG. 1 is a partial cross-sectional view of a wine glass via structure.
Figure 2:
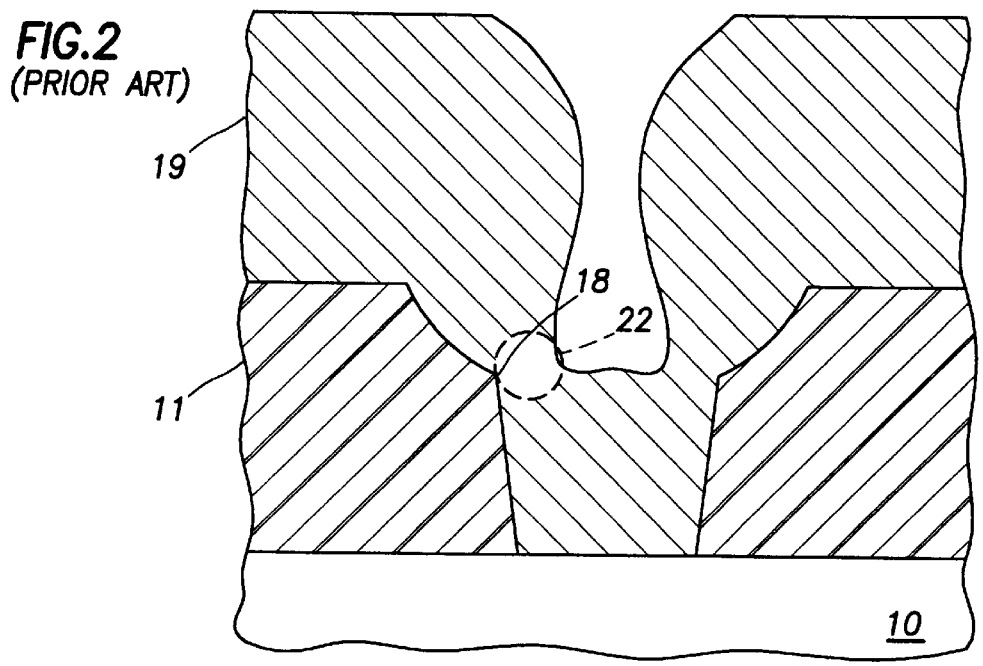
FIG. 2 is a processing step subsequent to FIG. 1, in which a second conductive layer has been deposited within the wine glass contact structure.
Figure 3:
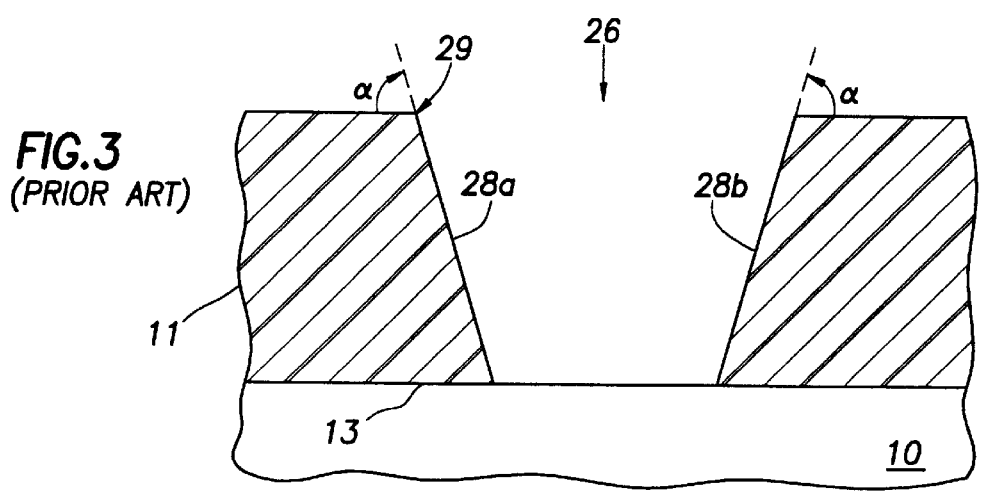
FIG. 3 is a partial cross-sectional view of a tapered contract structure.
Figure 4:
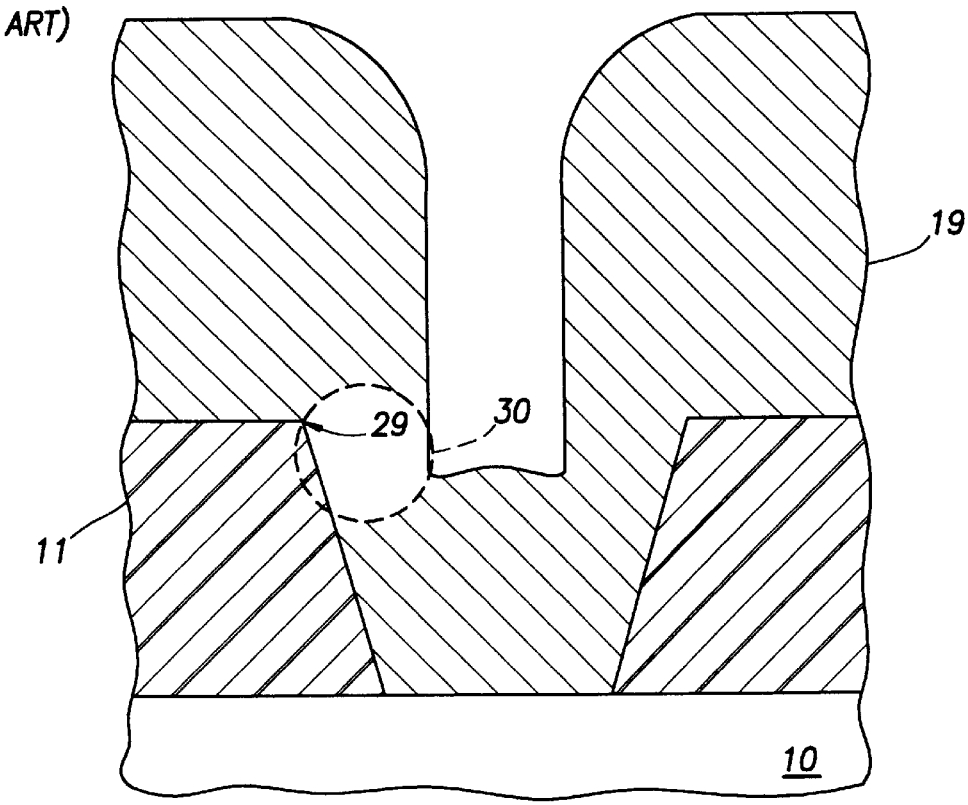
FIG. 4 is a processing step subsequent to FIG. 3, in which a second conductive layer has been formed upon and within the tapered contact structure.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE INVENTION

Figure 6:
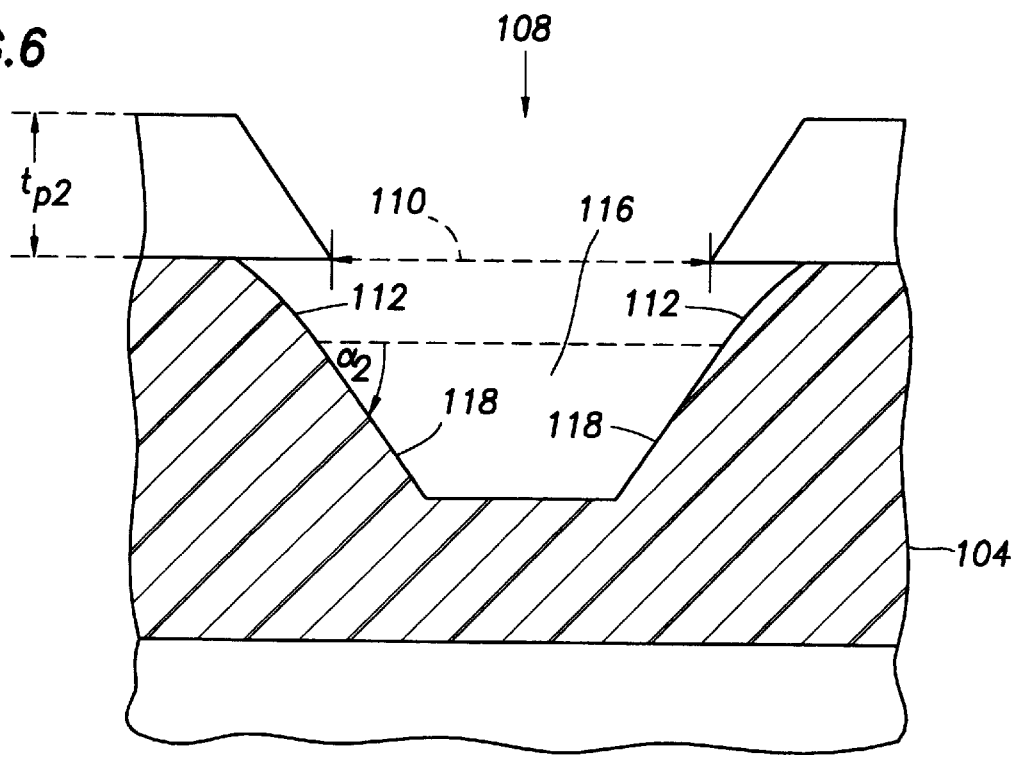
FIG. 6 is a processing step subsequent to FIG. 5, in which a second stage of a fluted via has been formed.
Figure 7:
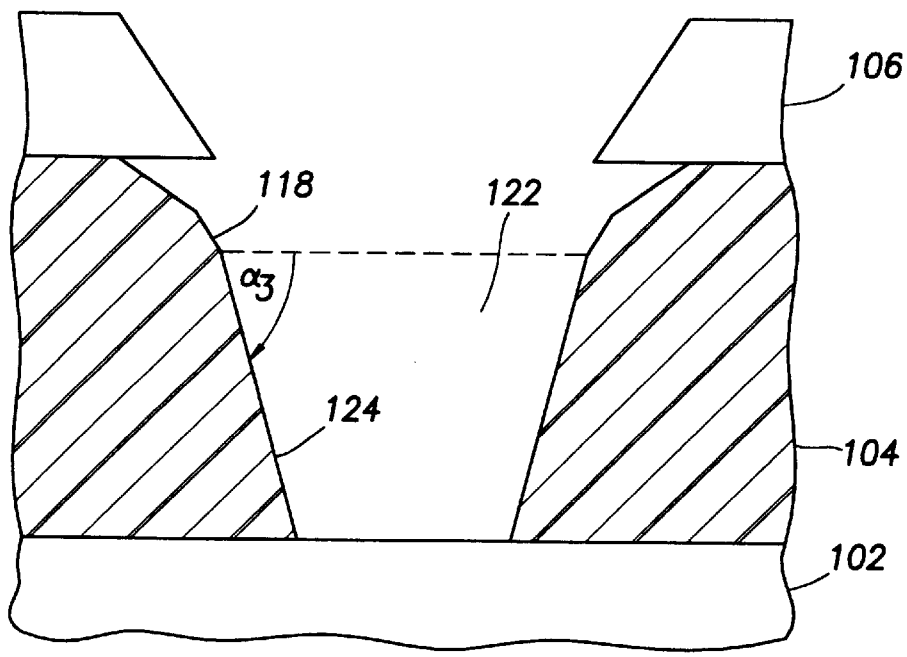
FIG. 7 is a processing step subsequent to FIG. 6, in which a third stage of a fluted via has been formed.
Figure 8:
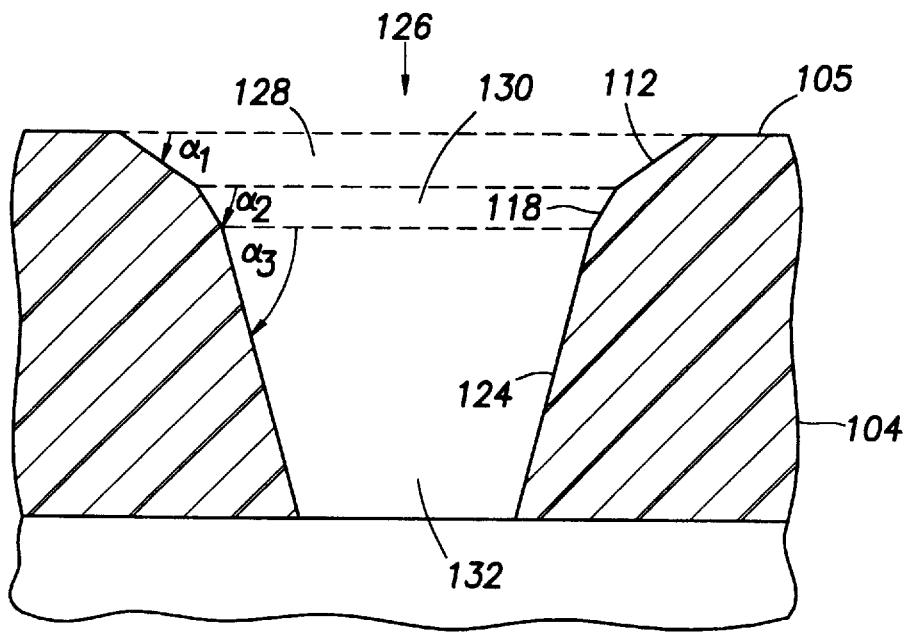
FIG. 8 is a processing step subsequent to FIG. 7, in which a photoresist layer has been removed from an upper surface of the dielectric layer.

Turning now to FIGS. 5–9, a presently preferred sequence for forming a fluted via according to the present invention is depicted. Turning briefly to FIG. 8, a fluted via 126 is shown. Fluted via 126 is formed within dielectric layer 104 and extends from an upper surface of dielectric layer 104 to an upper surface of conductive layer 102 upon which dielectric layer 104 resides. Fluted via 126 includes upper region 128, intermediate region 130 and lower region 132. Lower region 132 is defined by third stage sidewall 124. Third stage sidewall 124 forms an angle $\alpha_3$ with a line drawn parallel to upper surface 105 of dielectric layer 104. In the presently preferred embodiment, $\alpha_3$ is between 60° and 80° and more preferably is approximately equal to 75°. Intermediate region 130 of fluted contact 126 is defined by second stage sidewall 118. Second stage sidewall 118 extends from an upper portion of third stage sidewall 124 and forms an angle $\alpha_2$ with a line drawn parallel to upper surface 105 of dielectric layer 104. Angle $\alpha_2$ is preferably between 40° and 60° and is still more preferably approximately equal to 55°. Fluted via 126 further includes upper region 128 defined by first stage sidewall 112. First stage sidewall 112 forms an angle $\alpha_1$, with upper surface 105 of dielectric layer 104. In the presently preferred embodiment, $\alpha_1$, is less than 50° and still more preferably equal to approximately 35°.

By integrating the three distinct sidewall profiles of first stage sidewall 112, second stage sidewall 124, and third stage sidewall 118, fluted via 126 achieves a substantially continuous and gradually sloping profile extending to an upper surface of conductive layer 102. By adjusting the time used to form each region of fluted via 126, the sidewall profile can be controllably maintained and adjusted. The continuous and gradually sloping sidewall structure of fluted via 126 is more conducive to adequate step coverage during a subsequent deposition of a conductive layer.

Figure 5:
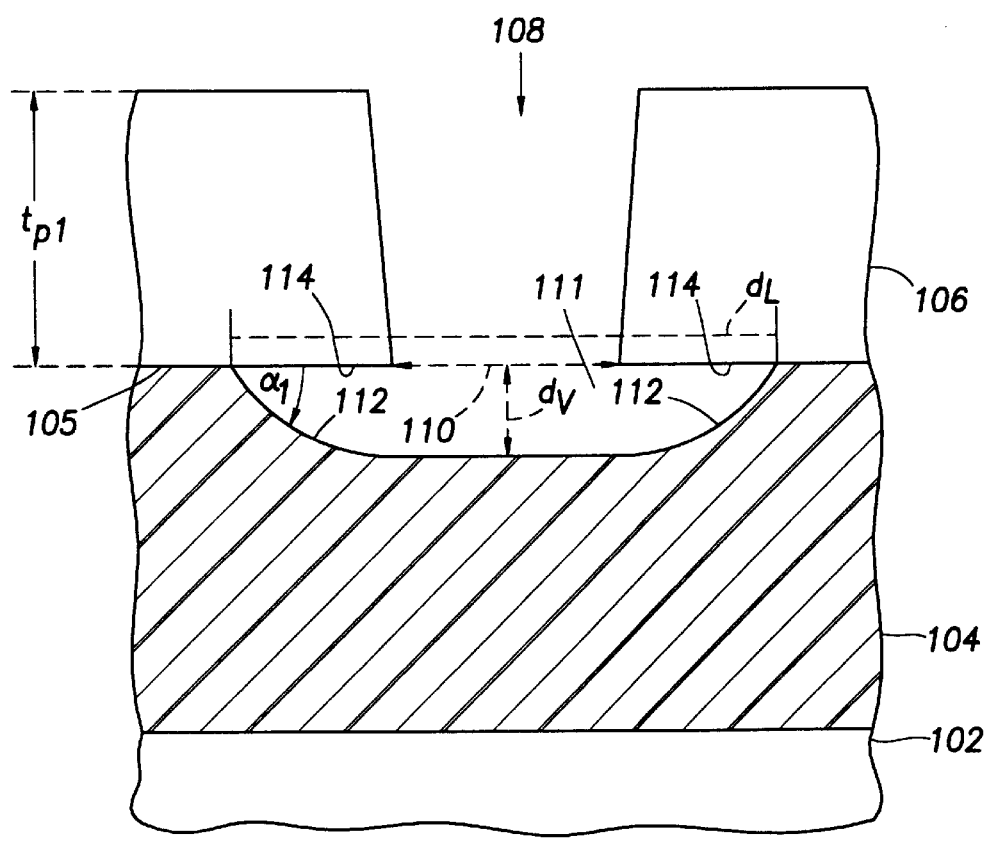
FIG. 5 is a partial cross-sectional view of a first stage of a fluted via formed in a dielectric layer.

Turning now to FIG. 5, the process sequence for forming fluted. via 126 is shown. A first conductive layer 102 is formed upon a semiconductor substrate (not shown in the drawing). The semiconductor substrate typically comprises a lightly doped silicon bulk into which a plurality of transistor devices have been fabricated. A dielectric layer is typically formed on top of the plurality of transistor devices after which portions of the dielectric layer are selectively removed so that a subsequent conductive layer can be selectively connected to the transistor devices.

Preferably, first conductive layer 102 comprises heavily doped polysilicon (i.e., polysilicon having a sheet resistivity less than 500 ohms/square), an aluminum alloy, or other conductive material. Dielectric layer 104 typically comprises a chemically-vapor deposited oxide, as is well known in the art. In an exemplary embodiment, dielectric layer 104 is formed by a plasma enhanced CVD process with a TEOS source. Photoresist layer 106 is suitably deposited upon dielectric layer 104 using conventional photoresist processing techniques. Photoresist layer 106 is then patterned, preferably with an optical aligner and a photomask, to create opening 108 in photoresist layer 106 thereby exposing contact region 110 of dielectric layer 104. Next, a first etch step is performed to create a first stage 111 of fluted via 126. First stage 111 includes first stage sidewall 112, which forms an angle $\alpha_1$ with an upper surface 105 of dielectric layer 104. Angle $\alpha_1$ is preferably less than 50° and is still more preferably equal or approximately equal to 35°. First stage 111 includes a lateral dimension $d_L$ and a vertical dimension $d_v$. In the preferred embodiment, the lateral dimension $d_L$ is greater than or equal to the vertical dimension $d_v$. In one embodiment, first stage 111 is formed with a plasma etch process utilizing an $NF_3/He/O_2$ mixture in an approximate ratio of 500:200:0. Such an etch process can be accomplished with commercially available oxide etch systems such as the LAM 4520i available from Lam Research. The preferred first etch process results in undercutting of photoresist layer 106 such that peripheral portions 114 of photoresist layer 106 effectively shadow portions of first sidewall stage 112. In an embodiment in which the dielectric layer 104 comprises a plasma TEOS film, the lateral etch rate of the first etch process is approximately 1.5 to 1.8 times the vertical etch rate. This ratio may vary with the composition of dielectric layer 104 and appropriate adjustments to the first etch chemistry may be necessary to achieve the desired undercutting. Peripheral portion 114 of photoresist layer 106 protects portions of first sidewall stage 112 proximal to upper surface 105 of dielectric layer 104 from subsequent etch processes. Alterratively, first stage 111 can be formed with a wet etch process. In a wet etch embodiment of the first etch process in which dielectric layer 104 comprises oxide, first stage 111 may be formed with an HF dip as is well known in the field of semiconductor manufacturing.

Turning now to FIG. 6, second stage 116 of fluted via 126 is formed by further removing portions of dielectric layer 104 from contact region 110. Second stage 116 includes second stage sidewall 118. Second stage sidewall 118 extends from first stage sidewall 112 at an angle $a_2$ preferably in the range of 40° to 70°, and still more preferably approximately equal to 55°. In a presently preferred embodiment, the second etch step comprises a plasma etch process in which Ar, $CF_4$, $CHF_3$, He, and $O_2$ are present in an approximate ratio of 110:10:40:250:50. In the preferred embodiment, the relatively high concentration of $O_2$ in the etch chamber during the second etch step etches photoresist layer 106 as well as dielectric layer 104. This results in a decrease in the thickness $t_p$ of photoresist layer 106 and a lateral expansion of opening 108. The second etch step is preferably carried out at a relatively high pressure to increase the isotropy of the etch. In a presently preferred embodiment of the second etch step, the chamber pressure is greater than or equal to approximately 1100 milliTorr. As the second etch step proceeds, the decrease in the thickness $t_p$ of photoresist layer 106, the increase in the lateral dimension of opening 108, and the high pressure combine to produce a sidewall profile having an angle $\alpha_2$ in the preferred range. Second sidewall is substantially non-vertical since energetic ions have an increased probability of striking sidewall 118 at an angle.

Turning now to FIG. 7, a third etch step is performed to create a third and final stage 122 of fluted via 126. In a presently preferred embodiment, the third etch step is accomplished in a plasma etch reactor wherein Ar, $CF_4$, $CHF_3$, He, and $O_2$ are present in an approximate ratio of 100:10:70:350:5. The third etch step produces third stage sidewall 124, which extends from second sidewall stage 118 at an angle $\alpha_3$. In a preferred embodiment, $\alpha_3$ is in the approximate range of 60° to 80°. The relative lack of $O_2$ present in the preferred embodiment of the third etch step prevents significant further etching of photoresist layer 106.The reduced thickness $t_{p2}$ of photoresist layer and the increased lateral dimension of opening 108 produced by the second etch step increases the range of angles from which energetic ions collide with sidewall 124, thereby reducing $\alpha_3$ to the desired range. Ideally, the first, second, and third Etch steps are performed using a single plasma etch apparatus. A commercially available example of a plasma etch apparatus capable of performing a first, second, and third etch steps is the LAM 4520i oxide etch system available from LAM Research.

FIG. 8 discloses a processing step subsequent to FIG. 7 in which photoresist layer 106 has been removed. As shown in FIG. 8, fluted via 126 comprises upper region 128, intermediate region 130, and lower region 132. Upper region 128 includes first stage sidewall 112, which extends from an upper surface 105 of dielectric layer 104 at an angle $\alpha_1$. In the preferred embodiment, $\alpha_1$, is less than or equal to 50° and is still more preferably approximately equal to 35°. Intermediate region 130 comprises second sidewall stage 118 which extends from first sidewall stage 112 at an angle $a_2$. In the preferred embodiment, angle $\alpha_2$ is approximately 40° to 70° and, still more preferably, equal to approximately 55° .Lower region 132 of fluted via 126 includes third sidewall stage 124 which extends from second sidewall stage 124 at an angle $\alpha_3$. In the preferred embodiment, $\alpha_3$ is in the range of 60°–80° and is still more preferably equal to approximately 75°. Fluted via 126 extends from upper surface 105 of dielectric layer 104 to an upper surface of first conductive layer 102.

Figure 9:
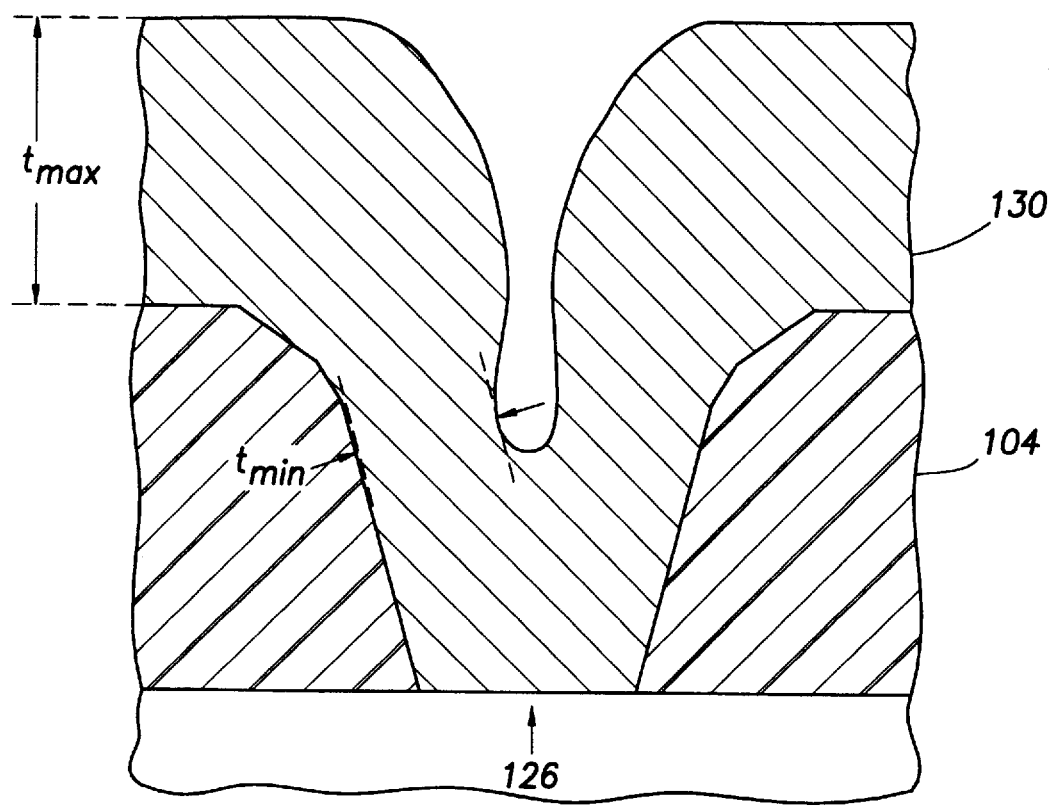
FIG. 9 is a processing step subsequent to FIG. 8, in which a second conductive layer has been formed upon and within the fluted via structure.

Turning to FIG. 9, a second conductive layer 130 has been deposited upon dielectric layer 104 and within fluted via 126 to form a contact 132 with first conductive layer 102. The fluted via 126 results in a second conductive layer 130 step coverage, defined as the ratio of $t_{min}$ divided by $t_{max}$ where $t_{min}$, is equal to the minimum thickness of second conductive layer 130 and $t_{max}$ is the maximum film thickness of second conductive layer 130. In the preferred embodiment, the second conductive layer 130 step coverage over third via 126 is approximately equal to or greater than 30°. It is to be understood that the embodiment of fluted via 126 shown in FIG. 8 is but one possible specific embodiment. By selectively controlling the etch times of the first, second, and third etch steps, the relative dimensions of first sidewalls 112, second sidewalls 118, and third sidewalls 124 can be precisely controlled. In this manner, fluted via 126 provides a gently sloping and continuously curving sidewall profile conducive to superior metal step coverage.

It will be appreciated to those skilled in the art having the benefit of this disclosure that this invention is generally useful in forming a via in an interlevel dielectric that is conducive to increased step coverage by a subsequently deposited conductive layer. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and accordingly, the specification and drawings are to be regarded in an illustrative rather than a restrictive sense.

What is claimed is:

1. In a semiconductor device, an interlevel contact structure comprising:

a first conductive layer formed on an upper surface of a semiconductor substrate;

an interlevel dielectric layer formed on said first conductive layer wherein said interlevel dielectric layer includes a fluted via defined by an annular sidewall of said dielectric layer wherein said annular sidewall extends from an upper surface of said dielectric layer to an upper layer of said first conductive layer and wherein said annular sidewall includes a first stage sidewall extending from said upper surface of said dielectric layer to a second sidewall stage of said annular sidewall at an angle of less than 50° and further wherein said second sidewall stage extends from said first sidewall stage to a third sidewall stage at an angle of between 40° and 70° and wherein said third sidewall stage extends from said second sidewall stage to an upper surface of said first conductive layer at an angle of between 60° and 80°; and a second conductive layer formed on said inter-level dielectric and within said fluted via such that said second conductive layer contacts said first conductive layer.

2. The contact structure of claim 1 wherein said first conductive layer comprises a material selected from the group consisting heavily doped polysilicon and an aluminum alloy.

3. The contact structure of claim 1 wherein said second conductive layer comprises an aluminum alloy.

4. The contact structure of claim 1 wherein said dielectric layer comprises a deposited oxide material.

5. The contact structure of claim 1 wherein the step coverage of the second conductive layer in said fluted via is approximately equal to or greater than 30%.

* * * * *